United States Patent [19]

Wada et al.

[11] Patent Number: 4,719,498
[45] Date of Patent: Jan. 12, 1988

[54] OPTOELECTRONIC INTEGRATED CIRCUIT

[75] Inventors: Osamu Wada, Isehara; Tatsuyuki Sanada, Yokohama; Shuichi Miura; Hideki Machida, both of Atsugi; Shigenobu Yamakoshi, Ebina; Teruo Sakurai, Sagamihara, all of Japan

[73] Assignee: Fujitsu Limited, Kawasaki, Japan

[21] Appl. No.: 734,319

[22] Filed: May 14, 1985

[30] Foreign Application Priority Data

| May 18, 1984 | [JP] | Japan | 59-098542 |
| May 18, 1984 | [JP] | Japan | 59-098543 |
| May 18, 1984 | [JP] | Japan | 59-098544 |
| May 19, 1984 | [JP] | Japan | 59-099691 |
| Jun. 29, 1984 | [JP] | Japan | 59-133298 |

[51] Int. Cl.$^4$ ................ H01L 27/14; H01L 31/00
[52] U.S. Cl. ........................... 357/30; 357/40; 357/41; 357/55; 357/56; 372/50
[58] Field of Search ............ 357/30, 30 I, 30 D, 357/41, 40, 55, 56, 17, 22; 372/50

[56] References Cited

U.S. PATENT DOCUMENTS 4,490,735 12/1984 Schwaderer .................. 357/41

OTHER PUBLICATIONS

Ury et al., "Monolithic Intergration of an Injection Laser and a Metal Semiconductor Field Effect Transistor", Appl. Phys. Lett., 34(7), Apr. 1, 1979, pp. 430–431.
Witt et al., "Low Threshold be Implanted (GaAl)As Laser On Semi-Insulating Substrate", IEEE Journal of Quantum Electronics, vol. QE-16, No. 4, Apr. 1980, pp. 390–391.
A New Fabrication Technique for Optoelectronic Integrated Circuits, Journal of the Electrochemical Society, Aug. 1985, pp. 1996–2002.

Primary Examiner—James W. Davie
Assistant Examiner—Georgia Y. Epps
Attorney, Agent, or Firm—Armstrong, Nikaido, Marmelstein & Kubovcik

[57] ABSTRACT

A semiconductor device including a substrate having a low substrate surface formed in the substrate with a first gentle slope from the substrate surface; a single crystalline layer formed on the low substrate surface nearly level with the substrate surface and having a gentle slope facing the first gentle slope; an optical semiconductor element is constructed using the single crystalline layer. An electronic semiconductor element is constructed using the substrate surface. A wiring layer connects electrodes of the optical semiconductor element and the electronic semiconductor element through the first and the second gentle slopes.

4 Claims, 27 Drawing Figures

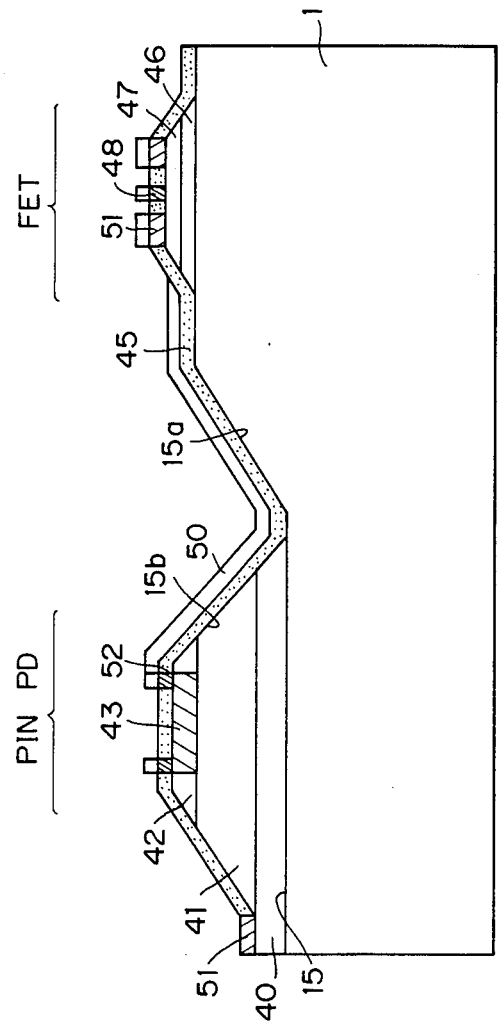

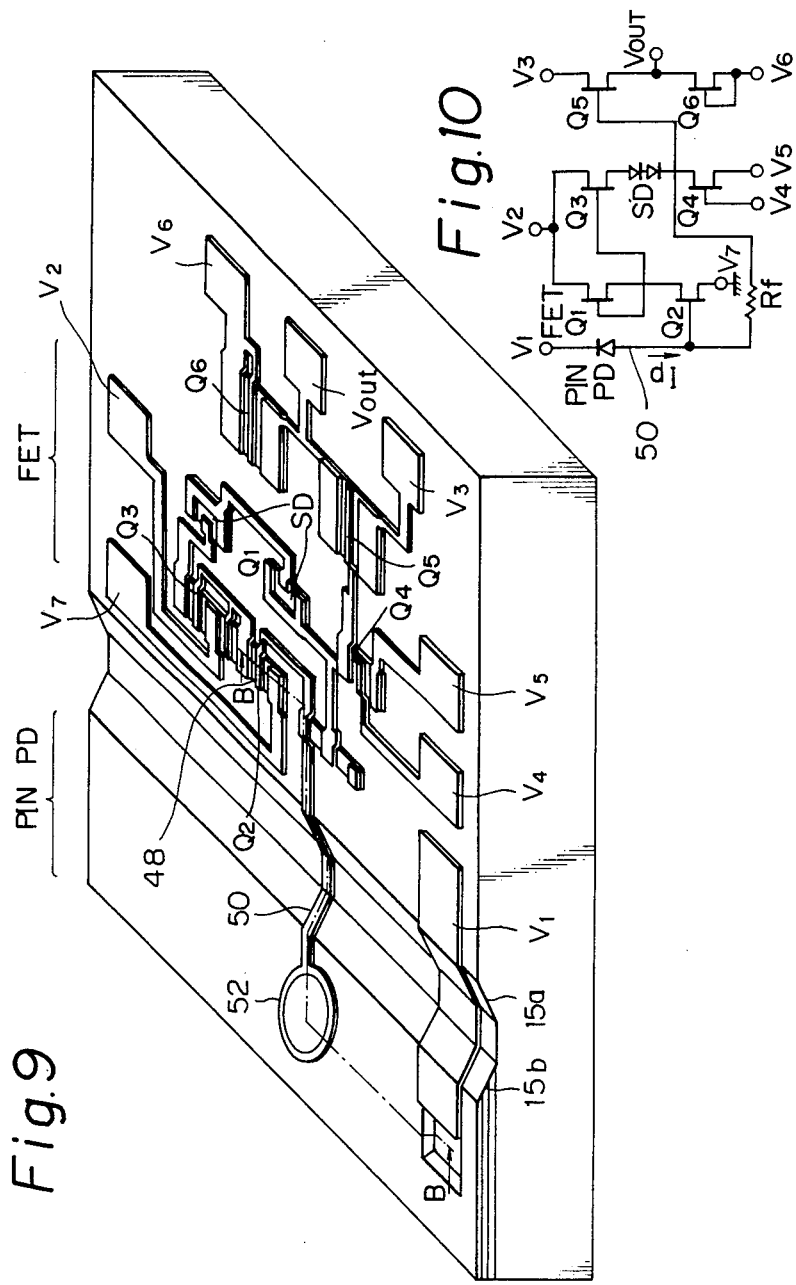

OPTOELECTRONIC INTEGRATED CIRCUIT

BACKGROUND OF THE INVENTION

1. Field of the Invention

The present invention relates to a semiconductor device and a method for producing the same, more particularly to a semiconductor device in which both optical semiconductor elements and ordinary electronic semiconductor elements are substantially flatly formed on a single substrate.

2. Description of the Related Art

Recent advances in the technologies of crystal growth and device production have make it possible to combine optical and electronic devices into a single chip. Such an optoelectronic integrated circuit (OEIC) is not only smaller and easier to use in various systems but also speedier, more reliable, and less noisy than hybridized discrete devices. A particularly attractive and important OEIC is one wherein an optical semiconductor element, for example, a laser diode (LD) or photo diode (PD), is monolithically integrated with a field effect transistor (FET) driver.

In fabricating a laser/FET unit or PD/FET unit, there is a problem in how to match the laser structure to the FET structure, as each component has a very different layer structure. A laser has a higher structure than FET's. As conventional photolithographic technology requires a wafer with an even surface, the laser must therefore be formed in an etched groove. Assuming the substrate is one of (100) oriented semiinsulating GaAs substrate, when the substrate is chemically etched, a (01$\bar{1}$) face is exposed as a side wall, the (01$\bar{1}$) face forms a 55° angle with respect to the (100) top surface so that a groove having a sharp step is formed. This shart step itself, however, makes application of the photolithographic technology difficult. Thus, high integration of the laser/FET unit becomes difficult.

Further, the sharp 55° angle step often results in breakage of wiring and thus a reduced production yield.

SUMMARY OF THE INVENTION

An object of the present invention is to eliminate the above disadvantages of the prior art.

Another object of the present invention is to provide a method for producing a semiconductor device wherein both optical semiconductor elements such as, a laser diode, and ordinary electronic semiconductor elements, such as an FET, are formed nearly flatly on a single substrate.

Another object of the present invention is to provide a semiconductor device wherein optical semiconductor element/ordinary semiconductor unit is formed on single substrate with high integration.

According to the present invention, there is provided method for producing a semiconductor device including the steps of: forming a lower substrate surface, i.e. a recess area, in a substrate with a gentle slope from the substrate surface; forming on the lower substrate surface or recess area a single crystalline layer substantially level with the substrate surface; forming an optical semiconductor element and an electronic semiconductor element using the single crystalline layer and the substrate surface, respectively; and forming a wiring layer connecting the optical semiconductor element and the electronic semiconductor element on the gentle slope.

According to the present invention, there is further provided a semiconductor device including: a substrate having a lower substrate surface formed in the substrate with a first gentle slope from the substrate surface; a single crystalline layer formed on the substrate surface nearly level with the substrate surface and having a second gentle slope facing the first gentle slope; an optical semiconductor element is constructed using the single crystalline layer. An electronic semiconductor element is constructed using the substrate surface. A wiring layer connects electrodes of the optical semiconductor element and the electronic semiconductor element through the first and the second gentle slopes.

According to the present invention, there is still further provided a method for producing a semiconductor device including the steps of: forming a substrate; forming a low substrate surface in the substrate surface with a first gentle slope from the substrate surface; forming on the low substrate surface a single crystalline layer nearly level with the substrate surface; forming in the single crystalline layer a second gentle slope facing the first gentle slope; forming an optical semiconductor element using the single crystalline layer; forming an electronic semiconductor element using the substrate surface; and forming a wiring layer connecting the electrodes of the optical semiconductor element and the semiconductor element through the first and the second gentle slopes.

BRIEF DESCRIPTION OF THE DRAWINGS

FIG. 8 is a cross-sectional view of another embodiment of a device according to the present invention;

FIG. 9 is a perspective view relating to FIG. 8;

FIG. 10 is a schematic circuit diagram of the device of FIG. 9;

DESCRIPTION OF THE PREFERRED EMBODIMENTS

Preferred embodiments will now be described with reference to the drawings.

FIGS. 1A to 1K are cross-sectional views for explaining an embodiments of a method for producing a semiconductor device according to the present invention.

Figure 1A:
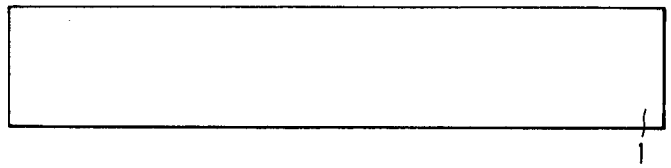
FIGS. 1A to 1K are cross-sectional views for explaining an embodiment of a method for producing a semiconductor device according to the present invention.
Figure 1B:
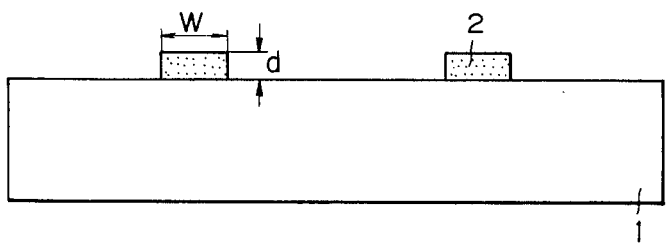

After providing a GaAs substrate 1 as shown in FIG. 1A, a photo resist 2 for example, AZ4620 (produced by Hoechst), having a thickness of 5 to 15 μm is formed over the surface of the GaAs substrate 1 and patterned in a stripe form, as shown in FIG. 1B.

The width W of the stripes of the resist layer may be 50 to 200 μm, preferably 100 μm. And the thickness d may be 7~8 μm.

Figure 1C:
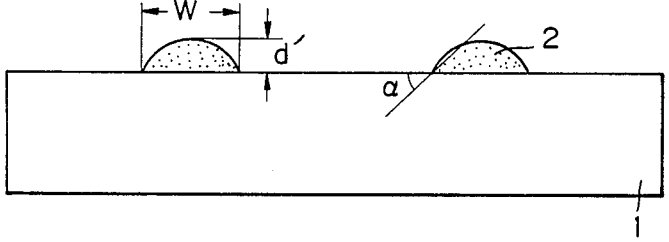

Next, as shown in FIG. 1C heat treatment for baking is carried out for 10 minutes at a temperature of 200° C. to change the edges of the resist layer 2 to gentle slopes and increase the thickness d' of the resist layer 2 to about 8 to 10 μm. In this heat treatment, the temperature is 200° C. which is higher than the usual post baking temperature 120° C. And the width W will not be changed so that the slope α of the edge of the mask 2 is approximately 5°~15°. The thickness d' of the resist mask should be larger than the total thickness of the semiconductor laser layer which will be formed in a groove later. There are some rules which decide the slope of the heated mask. That is, one relationship between W and d corresponds to one slope of the edge.

Figure 1D:
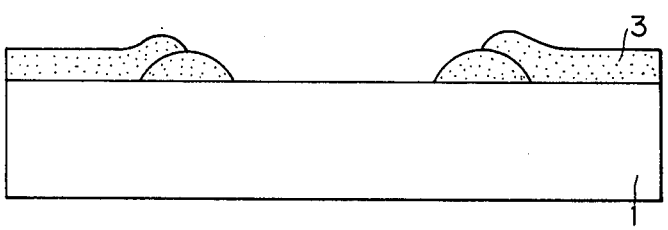

As shown in FIG. 1D, a resist layer 3 is formed over the obtained structure and then patterned. The patterned resist layer 3 has a thickness of 5 to 15 μm. Since the resist layer 2 had been heat-treated, it is not removed in the patterning process of the resist layer 3. Thus, the gentle slopes of the resist layer 2 facing the center in of FIG. 1D are exposed, which the other slopes are protected by the resist layer 3. A slight heat-treatment is carried out to dry the patterned resist layer 3.

Figure 1E:
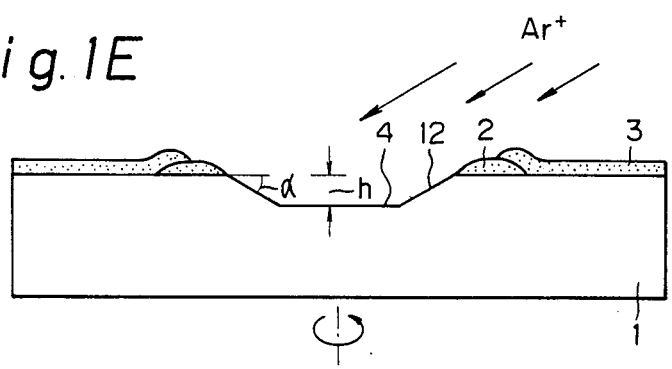

As shown in FIG. 1E, an ion beam etching, for example, argon ion (Ar+) beam etching, is used to etch a mesa while rotating the GaAs substrate 1: In this ion beam etching process, the ion beam irradiates the GaAs substrate 1 at an angle of about 70°. When the mesa height h is about 10 μm, the ion beam etching process is ended. Thus, a groove 4 having a slope 12 angle α of about 5° to 15° is formed in the GaAs substrate 1. The ion beam etching conditions are an acceleration voltage of 500 and an ion current density of 0.57 mA/cm². That is, the ion beam etching process etches all of the surface of the substrate equally, irrespectively of the various materials thereof. As a result, the surface shape of the mask 2,3 is shifted to the surface of the etched substrate 1.

Figure 1F:
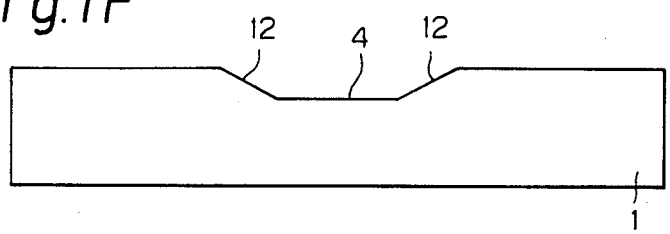

As shown in FIG. 1F, the resist layers 2 and 3 are then removed, resulting in a GaAs substrate 1 having a mesa type recess to groove 4 with a gentle slope 12.

Figure 1G:
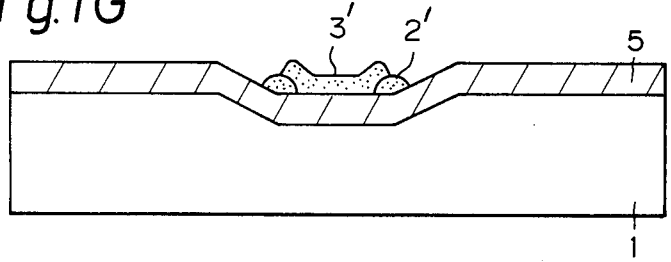

As shown in FIG. 1G, a semiconductor laser layer 5 consisting of an n+ type GaAs layer, n type Al$_{0.3}$Ga$_{0.7}$As layer, etc. is grown over the entire the GaAs substrate 1 by molecular-beam epitaxy (MBE). The structure of the layers corresponds to that of the optical semiconductor element, i.e. an LD or a PD.

Figure 1H:
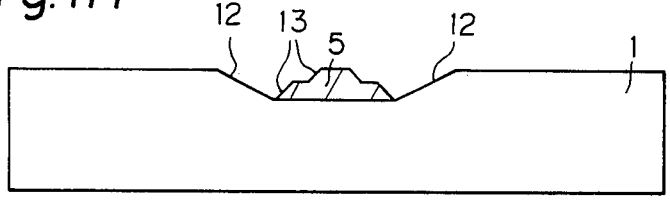

As shown in FIG. 1H, the semiconductor laser layer 5 is then patterned using two above-mentioned gentle-slope forming steps, which is shown as the mask 2', 3' in FIG. 1G.

Figure 1I:
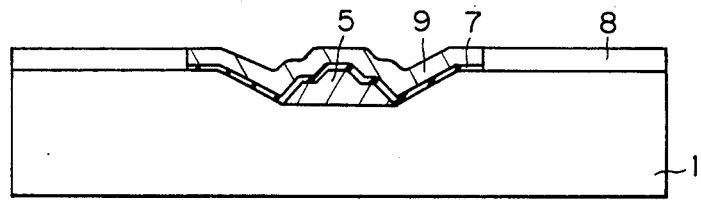

As shown in FIG. 1I an SiO$_2$ layer 7 is formed over the obtained structure and then patterned so that the SiO$_2$ layer covers the layer 5 formed in the etched groove. Then an FET epitaxial layer 8 is grown on the substrate while forming a polycrystalline (Al)GaAs layer 9 on the SiO$_2$ layer 7. The structure of the FET epitaxial layer 8 corresponds that of an FET the thickness of which is not as great as the semiconductor laser layer 5.

Figure 1J:
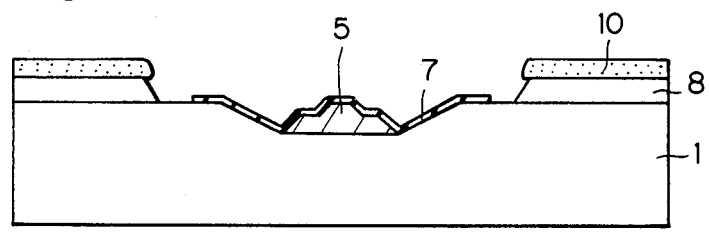
Figure 1K:
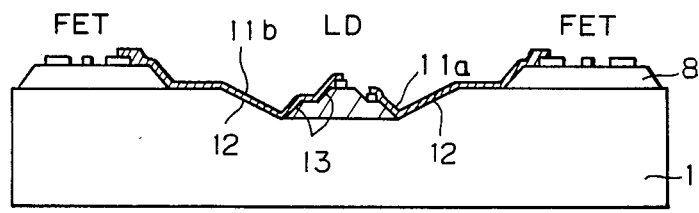

As shown in FIG. 1J, the polycrystalline (Al)GaAs layer 9 is removed by a chemical etching process using a resist layer 10 as a mask. After that, the SiO$_2$ layer 7 is also etched and the resist layer 10 is removed. Then, various LD and FET electrodes and a wiring layer 11a, 11b are formed on the gentle slope 12 as shown in FIG. 1K.

The reason for making the gentle slope 12 is mainly two points which are necessary for making the OEIC.

The first, in order to deposit the wiring layer on the slope between the LD and FET, the slope should be gentle; because it is quite difficult to deposite a sufficiently thick wiring layer on a sharp slope as used conventionally.

Secondly, in the patterning process of the wiring layer 11a, 11b formed on the entire surface of the substrate, a photo resist layer should be coated on the wiring layer. The thickness of the coating resist layer should be large enough to cover properly even on a sharp slope. This means the thickness of the resist coated on the upper surface where the FET's wiring is patterned becomes thick. This causes it to be impossible to make a fine pattern for the FET IC because of the thick resist. On the other hand, in the present invention, ince the slope is gentle, the coating resist can be thin where it is possible to make a fine pattern.

A detailed explanation relating to FIG. 1K will be given below.

Figure 2:
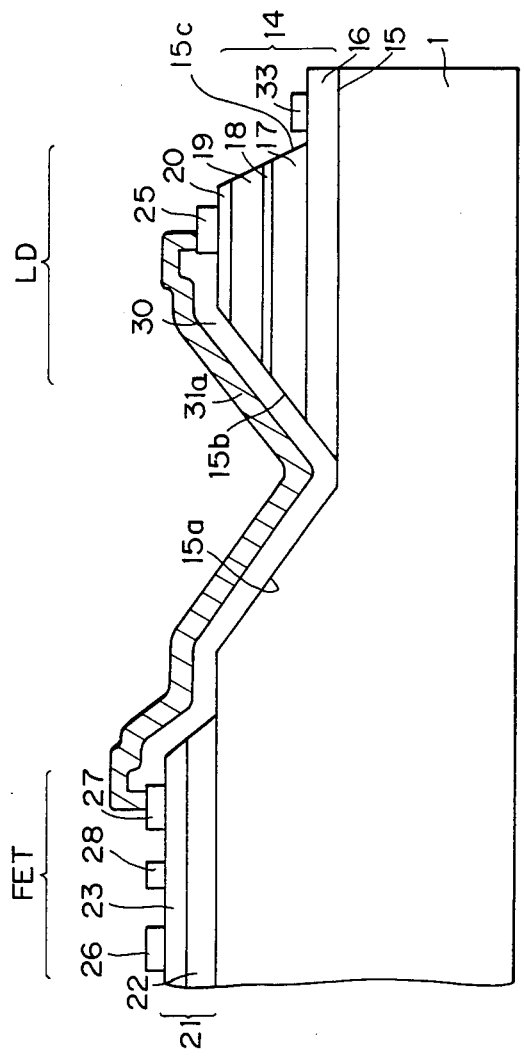
FIGS. 2 and 3 are partially enlarged cross-sectional views of FIG. 1K.

FIG. 2 is a partially enlarged cross-sectional view of FIG. 1K, illustrating an embodiment of a structure according to the present invention. In FIG. 2, reference numeral 1 represents the GaAs substrate, 14 the semiconductor laser layer structure which is multi-layer, 15 a recess, 15a, 15b, 15c a gentle slope, 16 an n side contact layer of an n+ type GaAs, 17 an n side clad layer of n type Al$_{0.3}$Ga$_{0.7}$As, 18 an active layer of either n type or p-type GaAs, 19 a p side clad layer of p type Al$_{0.3}$Ga$_{0.7}$As, 20 a p side contact layer of p+ type GaAs, 21 an FET layer, 22 an undoped GaAs layer, 23 an n GaAs FET active layer, 26 a p side contact electrode of AuZn, 26 a source electrode of AuGe/Ni, 27 a drain electrode of AuGe/Ni, 28 a gate electrode of Al, 30 an insulating layer of SiO$_2$, and 31a a wiring layer of Au/Cr. Although, in FIG. 1K, there is a step on the left hand side gentle slope, it is possible not to form such a step as shown at the gentle slope 15b in FIG. 2.

A method for producing the structure of FIG. 2 in which the p side contact electrode 25 is connected to the drain electrode 27 through the wiring layer formed on the gentle slopes 15a and 15b, will be explained below in detail.

After forming a recess 15 having the gentle slopes 15a as explained above, the n side contact layer 16, the n side clad layer 17, the active layer 18, the p side clad layer 19 and the p side contact layer 20 are successively formed. The multilayer 14 consisting of the n side contact layer 16 to the p side contact layer 20 is patterned by the above-mentioned gentle-slope forming process.

Then, the FET layer 21 consisting of the undoped GaAs layer 22 and n GaAs active layer 23 is formed by MBE, as explained above in FIG. 1I, 1J.

The p side contact electrode 25 for the LD is then formed on the p side contact layer 20 by a lift-off process.

After that, the n side contact electrode 33 is formed on the n side contact by a lift-off process and an alloying.

The source electrode 26 and the drain electrode 27 for the FET are also formed on the FET layer 21.

The insulating layer 30 is formed over the obtained structure by a sputtering process and is patterned by photolithography.

A wiring layer 31a is formed on the gentle slope 15a, 15b via the insulating layer 30 by a lift-off process.

Thus, the structure of FIG. 2 can be formed on a single GaAs substrate.

Figure 3:
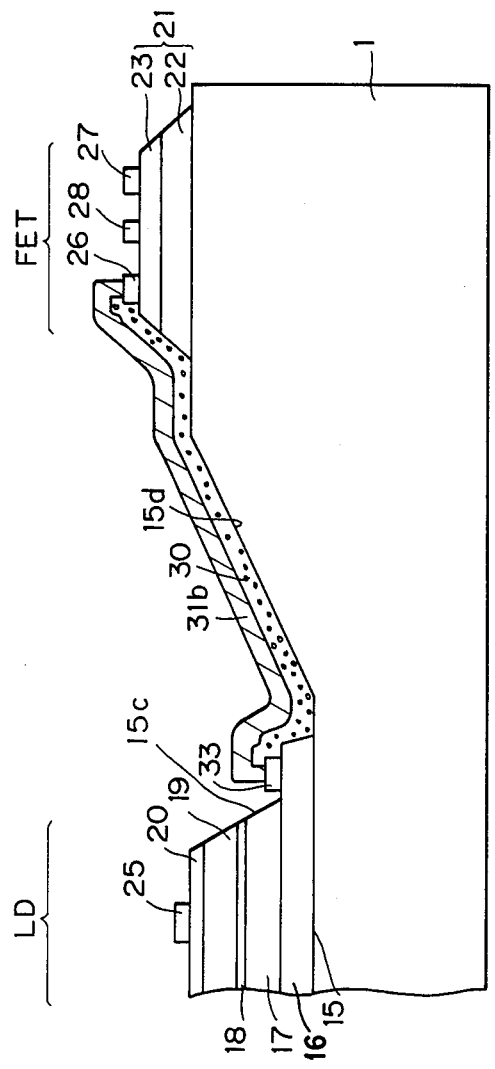

FIG. 3 is another partial enlarged cross-sectional view of FIG. 1K. In FIG. 3, the same reference numerals as in FIG. 2 represent the same portions.

As seen from the figure, the source electrode 26 is connected to the n side contact electrode 33 through the wiring 31b formed on the gentle slope 15d via the insulator layer 30.

Figures 4, 5:
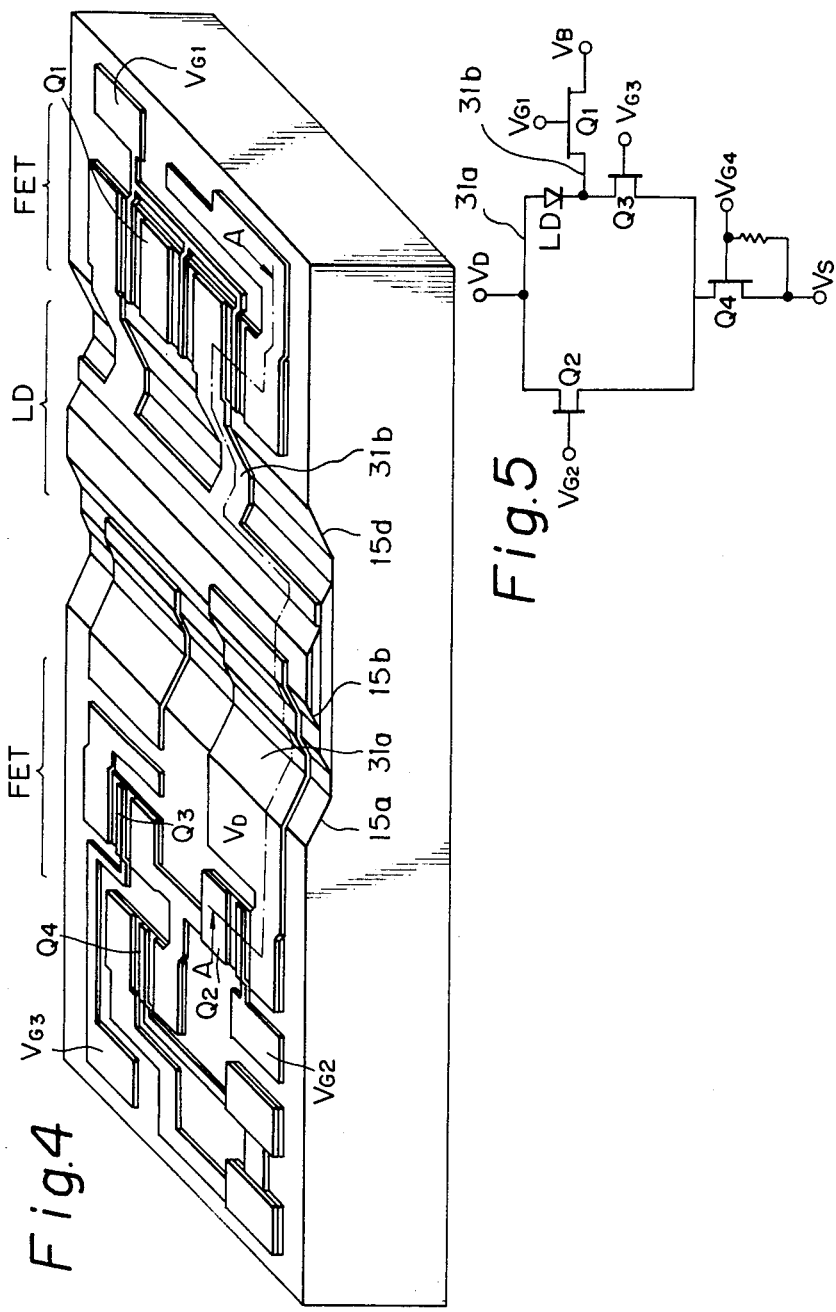
FIG. 4 is a perspective view of FIG. 1K.
FIG. 5 is a schematic circuit diagram of the devices of FIG. 4.

FIG. 4 is a perspective view relating to FIG. 1K, FIG. 1K being a cross-sectional view taken along the AA line.

FIG. 5 is a circuit diagram of the device of FIG. 4.

As easily understood from the accordance between the FIG. 4 and FIG. 5, the wiring 31a on the gentle slope 15a, 15b connects between the LD and the FET $Q_2$, and the wiring 31b on the gentle slope 15d connects between the LD and the FET $Q_1$. In this enbodiment, the LD and $Q_2$ can be connected by the wiring 31a formed in OEIC so that the characteristic of the OEIC is improved.

Figure 6A:
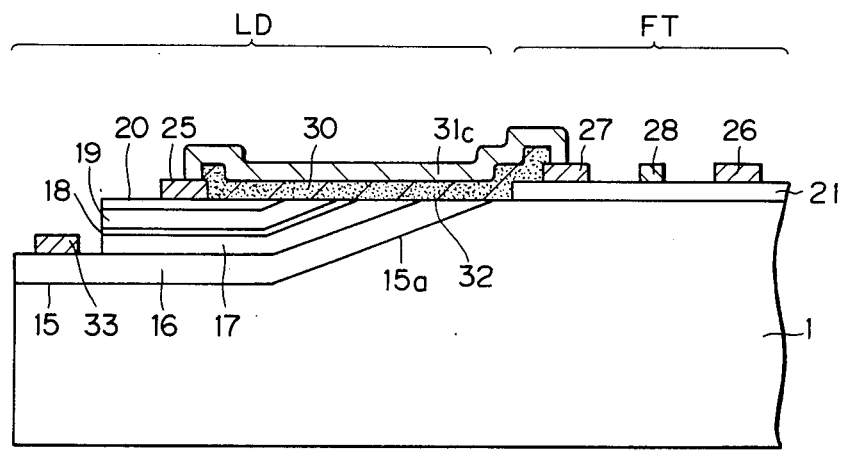
FIGS. 6A and 6B are is a cross-sectional views for explaining an embodiment of a semiconductor device according to the present invention.

FIG. 6A is a cross-sectional view for explaining another embodiment of a semiconductor device according to the present invention. In FIG. 6A, the LD and FET are also formed on a GaAs substrate 1. The drain electrode 27 is connected to the p side contact electrode 25 via the wiring 31c formed on the planar surface.

Figure 6B:
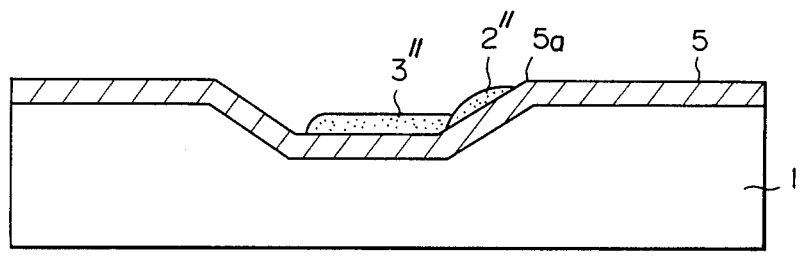

The process of this embodiment is almost same as the process shown in FIG. 1A-1H. That is, as shown in FIG. 6B, after forming the semiconductor laser layer 5, the combination mask 2" and 3" is formed so that the edge of the mask 2", 3" corresponds to the slope of the layer 5 (shown 5a). After that the planar surface 32 can be formed on the gentle slope 15a by performing the ion beam etching process as explained above.

Figure 7:
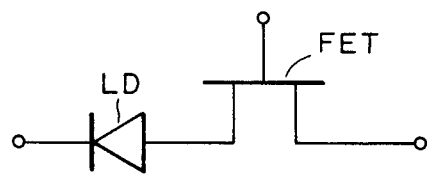
FIG. 7 is a schematic circuit diagram of the device of FIG. 6.

The same reference numerals as in FIG. 2 and 3 represent the same portions. FIG. 7 is a schematic circuit diagram of the device of FIG. 6.

FIG. 8 is a cross-sectional view of another embodiment of a device according to the present invention. In FIG. 8, a pin photo-diode (PIN PD) and an FET are formed on a single semi-insulating GaAs substrate 1. In FIG. 8, reference numeral 40 is an n+ type GaAs layer, 41 an n− type GaAs layer, 42 a high resistivity $Al_{0.3}Ga_{0.7}As$ layer, 43 a Zn diffused region, 45 an $Si_3N_4$ layer 46 an undoped GaAs layer, 47 an n type GaAs layer, 48 an Al electrode, 50 a wiring layer of Au/Ti, 51 an Au/AuGe electrode, and 52 an Au/Zn/Au electrode. As shown in FIG. 8, the Al electrode 48 is interconnected to the Au/Zn/Au electrode through an Au/Ti wiring layer 50 continuously laid on the gentle slopes 15a and 15b.

FIG. 9 is a perspective view of the device of FIG. 8 which is a cross sectional view of B—B.

FIG. 10 is a circuit diagram of the device of FIG. 9.

Figure 11A:
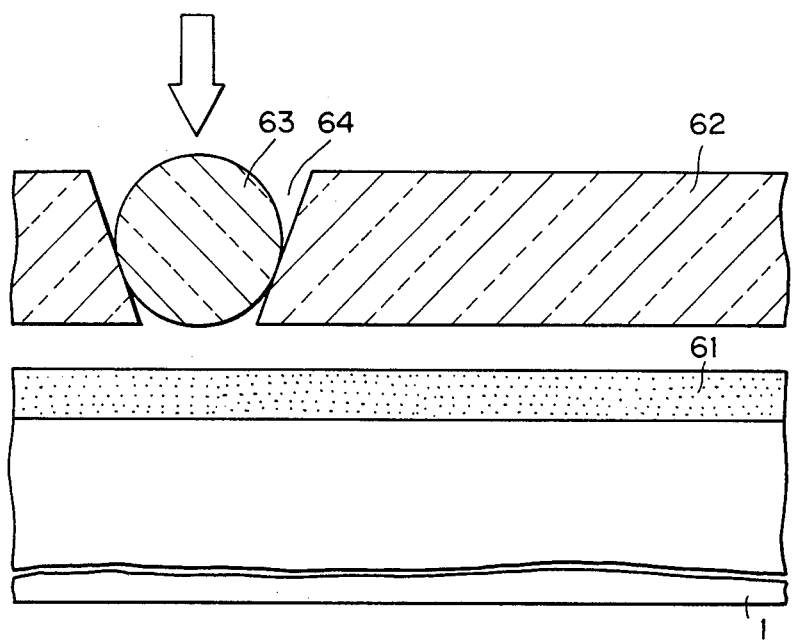
FIGS. 11A and 11B are cross-sectional views for explaining an embodiment of a method for forming a gentle step in a substrate.
Figure 11B:
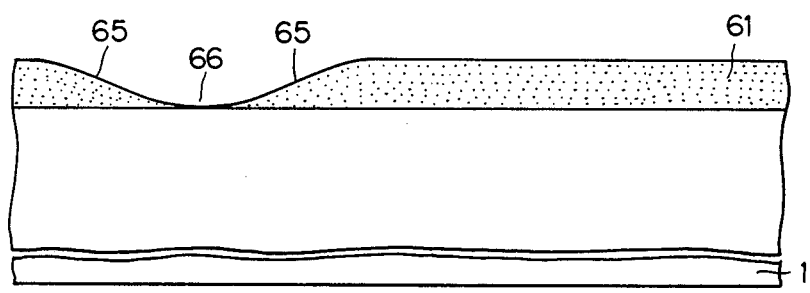

Another method for forming a recess having a gentle slope in a semi-insulating GaAs substrate will now be explained. FIGS. 11A and 11B are cross-sectional views of an embodiment explaining one of the methods. As shown in FIG. 11A, a resist layer 61 having a thickness of, for example, 6 μm is formed. The resist layer 61 is then exposed through a mask of a photosensitive glass 62 having a hole 64 with a taper wall and a glass fiber 63. The resist layer just under the glass fiber 63 is most exposed, and as the distance is larger from the position on the resist layer just under the glass fiber, the amount of exposure is gradually reduced.

Thus, as shown in FIG. 11B, the resist layer has a pattern 66 having a gentle slope 65.

After that, using ion etching or reactive ion etching, the entire surface of the obtained structure is etched. Thus, a recess having the same pattern 66 can be formed in the semi-insulating GaAs substrate 1.

Figure 12A:
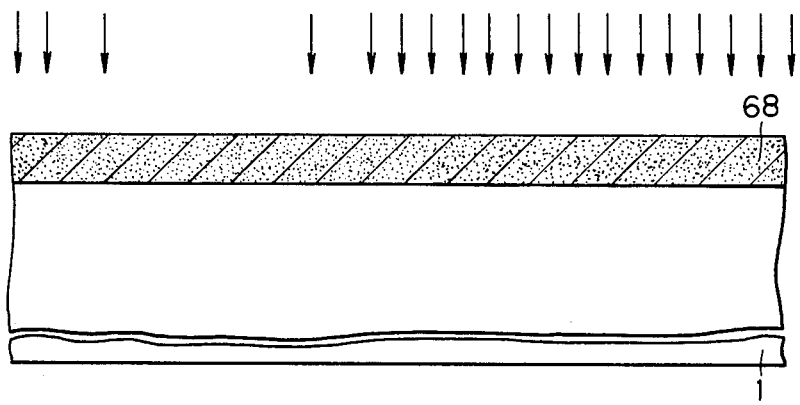
FIGS. 12A and 12B are cross-sectional views for explaining another embodiment of a method for forming a gentle step in a substrate.
Figure 12B:
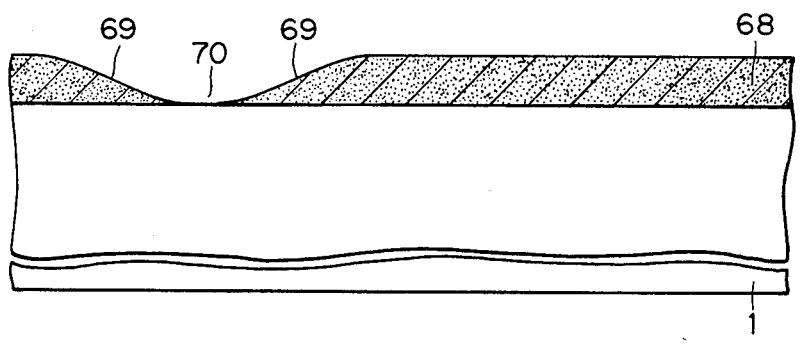

FIGS. 12A and 12B are cross-sectional views for explaining another embodiment of a method for forming a gentle slope in a substrate as shown in FIG. 12A, a polyimide layer 68 having a thickness of, for example, 6 μis formed on a semi-insultating GaAs substrate 1. The polyimide layer is irradiated with a laser so that a portion of the polyimide 68 in which a recess having a gentle slope is formed is irradiated less compared to the surrounding portion. The center of the recess forming portion may be not irradiated at all. After that, the recess forming process for the semi-insulating GaAs substrate is carried out as explained with FIG. 11B.

Figure 13A:
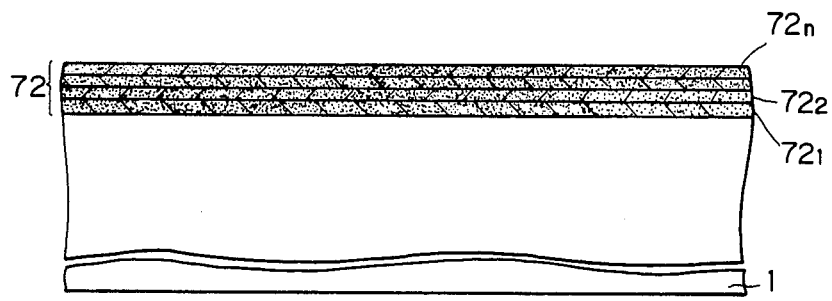
FIG. 13A and 13B are cross-section views for explaining still another embodiment of a method for forming a gentle step in a substrate.
Figure 13B:
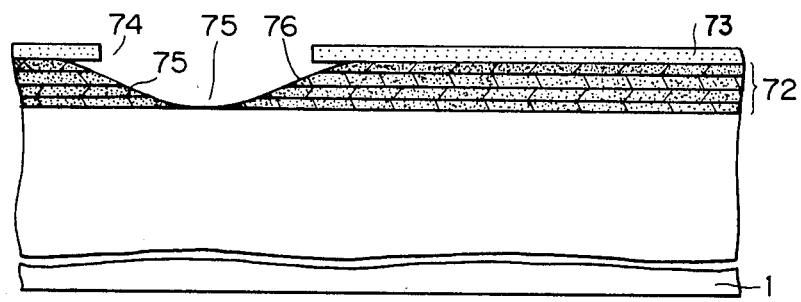

FIGS. 13A and 13B are cross-sectional views of another embodiment explaining a method for forming a gentle slope in a substrate. As shown in FIG. 13A, a first ployimide resin layer $72_1$ having a thickness of, for example, 6000 Å is formed on a semi-insulating GaAs substrate 1. Then, the first polyimide resin layer $72_1$ is heat-treated at a first temperature $T_1$ of, for example, 200° C. A second polyimide resin layer $72_2$ is formed on the first polyimide resin layer $72_1$ and is heat-treated at a second temperature $T_2$ of, for example, 180° C., lower than the first temperature $T_2$. The process is repeated until the nth polyimide layer is formed on the (n−1)th polyimide layer and is heat-treated at a temperature $T_n$ lower than temperature $T_{n-1}$. Thus, a polyimide resin multi-layer 72 is formed on the semi-insulating GaAs substrate. When a polyimide resin is heat-treated at a higher temperature, the etching rate is decreased.

Then, as shown in FIG. 13B the polyimide resin multilayer 72 is etched by an etchant, using a resist layer 73 having an opening 74 as a mask so that an recess 75 having a gentle slope 76 is formed in the polyimide multilayer 72. Then, the recess forming process as explained in FIG. 11B. is carried out for the semi-insulating GaAs substrate.

Furthermore, another embodiment will be explained by using the FIG. 13A, 13B. In this embodiment, the multi-layer $72_1$, $72_2$ . . . $72_n$ comprises $Al_xGa_{1-x}As$ layers in which the x is gradually increased from $72_1$ to $72_n$. Then, the wet etching process using an etchant containing HF is performed so that since the AlGaAs is etched faster than the GaAs or AlGaAs with a small quantity of Al, the etched pattern becomes as shown in FIG. 13B having a gentle slope 76. After that, there is an alternative way. The first way is that the ion beam etching is simply performed in the same manner as the previous explained process. The second way is that since the multi-layer 72 comprises AlGaAs compound semiconductor, the FET structure is formed on or in the multi-layer 72.

We claim:

1. An optoelectronic integrated circuit semiconductor device comprising:
 a semiconductor substrate having a first planar surface and a recess area therein having a lower planar surface and a first gentle slope between said first planar surface and said lower planar surface;

a multilayer optoelectronic semiconductor element formed on said lower planar surface and having a second planar surface nearly level with said first planar surface and a second gentle slope facing said first slope;

an electronic semiconductor element formed on said first planar surface;

electrode areas formed on said optoelectronic semiconductor element and said electronic semiconductor element; and a wiring layer formed on said first and second slopes for connecting said electrode areas to form said optoelectronic integrated circuit semiconductor device;

said first and second gentle slopes each having an angle with said planar surfaces in the range 5° to 15°.

2. A semiconductor device as recited in claim 1, wherein said optoelectronic semiconductor element is a laser diode.

3. A semiconductor device as recited in claim 1, wherein said optoelectronic semiconductor element is a photo-diode.

4. A semiconductor device as recited in claim 1, wherein said electronic semiconductor element is a field effect transistor.

* * * * *